United States Patent [19]

Nakamura

[11] Patent Number: 5,360,763
[45] Date of Patent: Nov. 1, 1994

[54] METHOD FOR FABRICATING AN OPTICAL SEMICONDUCTOR DEVICE

[75] Inventor: Takahiro Nakamura, Tokyo, Japan

[73] Assignee: NEC Corporation, Japan

[21] Appl. No.: 117,495

[22] Filed: Sep. 7, 1993

[30] Foreign Application Priority Data

Sep. 7, 1992 [JP] Japan .................. 4-237503
Sep. 7, 1992 [JP] Japan .................. 4-237504

[51] Int. Cl.$^5$ .......................... H01L 21/205
[52] U.S. Cl. .................. 437/129; 148/DIG. 95
[58] Field of Search ............. 437/129; 148/DIG. 95

[56] References Cited

U.S. PATENT DOCUMENTS

| | | | |
|---|---|---|---|
| 5,128,276 | 7/1992 | Ambrosius et al. | 437/129 |
| 5,237,639 | 8/1993 | Kato et al. | 437/129 |
| 5,250,462 | 10/1993 | Sasaki et al. | 437/129 |
| 5,278,094 | 1/1994 | Lievin et al. | 437/129 |
| 5,284,791 | 2/1994 | Sakata et al. | 437/129 |

FOREIGN PATENT DOCUMENTS

| | | | |
|---|---|---|---|
| 154287 | 9/1983 | Japan | 437/129 |
| 77185 | 4/1988 | Japan | 437/129 |

OTHER PUBLICATIONS

"Novel Structure Photonic Devices Using Selective MOVPE Growth" by Sasaki et al. NEC Res. & Develop. vol. 33, No. 3, Jul. 1992, pp. 372-382.

ECOC '92, Sep. 27, 1993, pp. 177 to 180, "1.55μm Wavelength-Tunable MQW-DBR-LDs Employing Bandgap Energy Control in All Selective MOVPE Growth".

Journal of Crystal Growth 107 (1991), pp. 226 to 230, "Lateral and Longitudinal Patterning of Semiconductor Structures by Crystal Growth on Nonpopular and Dielectric-Masked GaAs Substrate: Application to Thickness-Modulated Waveguide Structures".

*Primary Examiner*—R. Bruce Breneman
*Assistant Examiner*—Linda J. Fleck
*Attorney, Agent, or Firm*—Laff, Whitesel, Conte & Saret

[57] ABSTRACT

In the first method, an etching stop layer and a current blocking layer are grown on a semiconductor substrate by MOVPE. Next, the current blocking layer is etched on a region of the etching-stop layer corresponding to an active region, and the active region is formed in the etched portion by the selective growth using MOVPE. In the second method, a ridge is formed on a semiconductor substrate, and a doublehetero structure is grown on the ridge by MOVPE. On the active layer, a p-cladding layer is grown to be covered on the whole surface with (111) B plane entirely. The (111) B plane has the growth speed suppressing effect, so that no semiconductor layer is grown on the p-cladding layer, while a current blocking layer is grown on other regions.

5 Claims, 6 Drawing Sheets

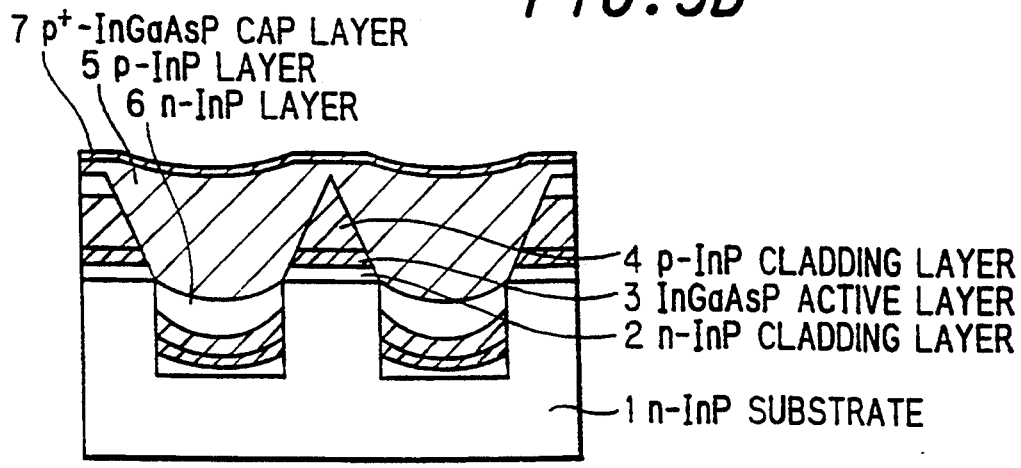
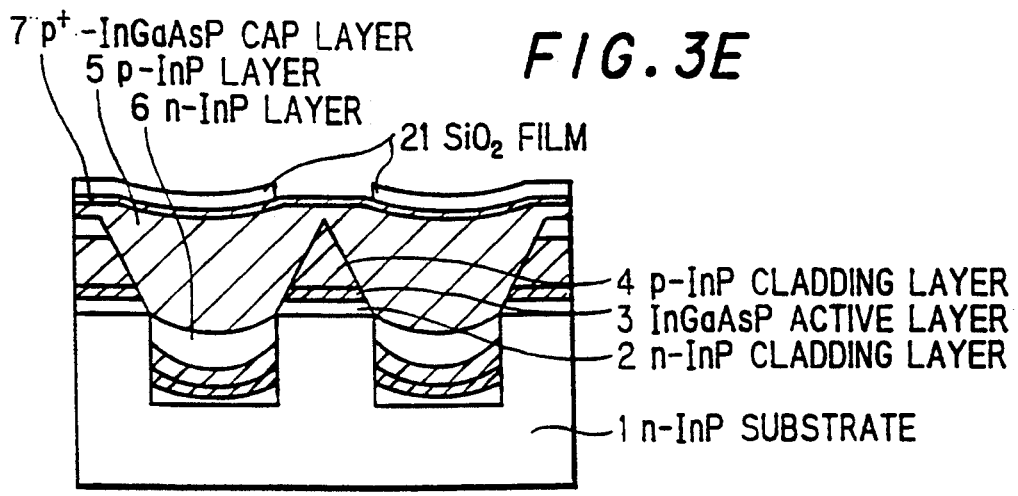
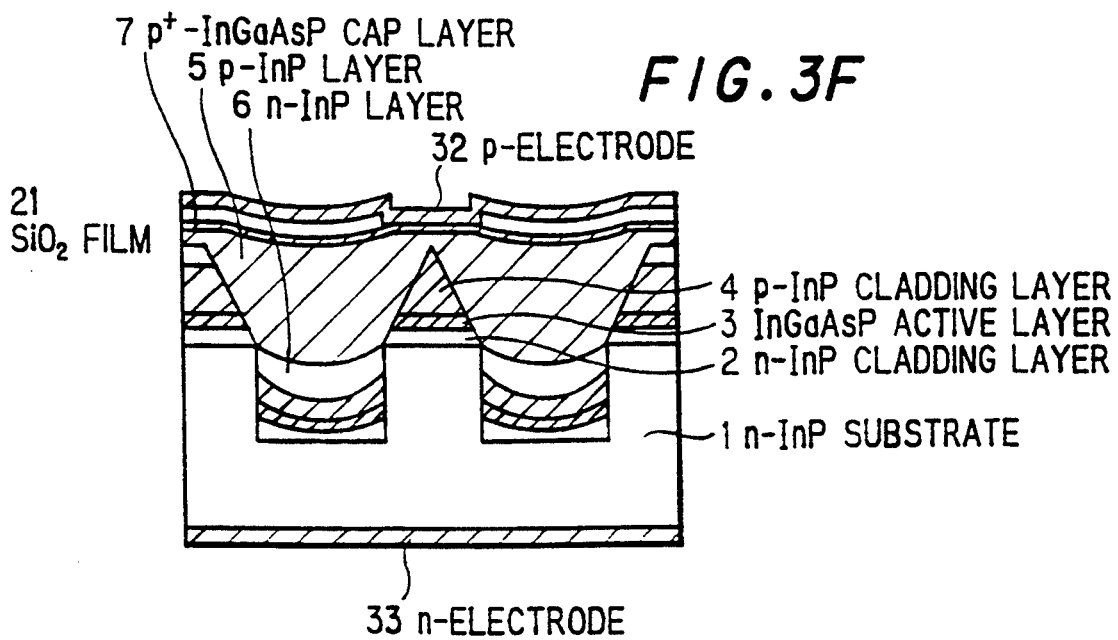

METHOD FOR FABRICATING AN OPTICAL SEMICONDUCTOR DEVICE

FIELD OF THE INVENTION

This invention relates to a method for fabricating an optical semiconductor device, and more particularly to a method in which an optical semiconductor device used for an optical communication system, an optical information processing system, etc. is fabricated.

BACKGROUND OF THE INVENTION

Semiconductor lasers used for an optical communication system, an optical information processing system, etc. have been required to have much higher performance than ever. At the same time, optical devices having high yield have been required to be fabricated by using large area wafers, so that the optical devices thus fabricated will be reduced in cost to be applied to subscriber's optical communication systems. In order to meet these requirements, it is required that crystal growth is carried out by vapor phase epitaxy such as metal organic vapor phase epitaxy making it possible to grow crystal on a large area with high uniformity. Further, if vapor phase epitaxy is used, the fabrication of quantum well-semiconductor laser having several features such as low threshold value, high efficiency-operation, etc. is possible to be carried out.

A conventional method for fabricating an optical semiconductor laser by using MOVPE is described on pages 226 to 230 in "Journal of Crystal Growth, Vol. 107".

In the conventional method, a distributed feedback type (DFB) laser operating in a single mode is fabricated by using the steps of farming a grating, an n-InGaAsP guide layer, an InGaAsP active layer, and a p-InP cladding layer successively on an n-InP substrate, forming a stripe-shaped $SiO_2$ film having a width of 2 $\mu$m on the p-InP cladding layer, wet-etching the layers grown on the n-InP substrate except for the portion masked by the $SiO_2$ film, forming a p-InP layer and a p$^+$-InGaAs cap layer on the whole surface on the n-InP substrate thus processed to bury the mesa structure, implanting protons into the cap layer to provide high resistance regions on the both sides of the active layer, and providing n- and p-electrodes for injecting current to the active layer.

The DFB laser thus fabricated has a structure for confining a current comprising a buried ridge and high resistance regions surrounding the buried ridge.

In the conventional method for fabricating an optical communication-semiconductor laser, however, there is a disadvantage in that the width of a waveguide is difficult to be well controlled due to the occurrence of side-etching, because the waveguide is fabricated by the wet-etching using the $SiO_2$ film as a mask, although thickness of the layers are adequately controlled in vapor phase epitaxy such as MOVPE. For instance, even if the width of the $SiO_2$ film is formed precisely by 2 $\mu$m, the width of the active layer is deviated due to the occurrence of the etching on the sides of the active layer and the mesa-structure. In a process using a large diameter wafer such as a two inch-substrate, especially, the deviation ranges large in the wafer. In the mesa-etching, if dry-etching is used, there is a further disadvantage in that the active layer is damaged to result in defects, although the width thereof is well controlled.

Due to the deviation of the waveguide including the active layer and the defects of the active layer, threshold value, oscillation wavelength, beam pattern, etc. are deteriorated to lower the reliability thereof, so that the yield of fabricating optical semiconductor devices is lower, and operation a expected is not obtained.

In the conventional method as described above, there is a still further disadvantage in that a process time becomes long, because at least two steps of crystal growth are required.

SUMMARY OF THE INVENTION

Accordingly, it is an object of the invention to provide a method for fabricating an optical semiconductor device in which the width of a waveguide is well controlled.

It is a further object of the invention to provide a method for fabricating an optical semiconductor device having a high yield.

It is a still further object of the invention to provide a method for fabricating an optical semiconductor device in which a process time is shortened.

According to the first feature of the invention, a method for fabricating an optical semiconductor device, comprises the steps of:
  forming an etching-stop layer, a current blocking layer, and a first dielectric layer successively on a semiconductor substrate;
  removing the first dielectric layer to provide stripes on the current blocking layer;
  etching the current blocking layer on the etching-stop layer by using the stripes as masks;
  filling a first semiconductor layer into an etched portion of the current blocking layer;
  carrying out a selective growth of a multiple layer structure including an active layer on the semiconductor layer; and
  proving p- and n-electrodes for injecting current to the active layer.

According to the second feature of the invention, a method for fabricating an optical semiconductor device, comprises the steps of:
  etching a semiconductor substrate to provide a ridge and grooves thereon;
  grooving a multiple layer structure including an active layer on the ridge and multiple layer structures in the grooves simultaneously, a top layer of the multiple layer structure including the active layer being grown to be covered on the active layer with (111) plane totally;
  grooving first semiconductor layers on the multiple layer structures in the grooves;
  grooving a second semiconductor to cover the multiple structure including the active layer on the ridge and a whole remaining portion of the etched semiconductor substrate; and
  providing p- and n-electrodes for injecting current to the active layer.

BRIEF DESCRIPTION OF THE DRAWINGS

The invention will be explained in more detail in conjunction with appended drawings, wherein:
FIGS. 3A to 3F are schematic cross-sectional views showing a method for fabricating an optical semiconductor device in a second preferred embodiment according to the invention.

DETAILED DESCRIPTION OF THE PREFERRED EMBODIMENTS

Before explaining a method for fabricating an optical semiconductor device in a preferred embodiment according to the invention, the aforementioned conventional method for fabricating an optical semiconductor laser will be explained in FIGS. 1A to 1E.

Figure 1A:
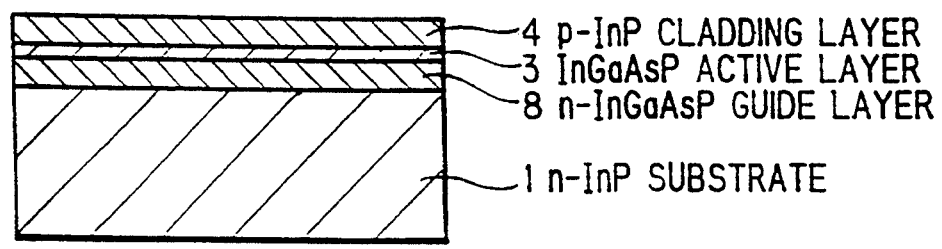
FIGS. 1A to 1E are schematic cross-sectional views showing a conventional method for fabricating an optical semiconductor laser.

In FIG. 1A, a grating is formed on an n-InP substrate 1, and an n-InGaAsP guide layer 8, an InGaAsP active layer 3, and a p-InP cladding layer 4 are successively grown thereon.

Figure 1B:
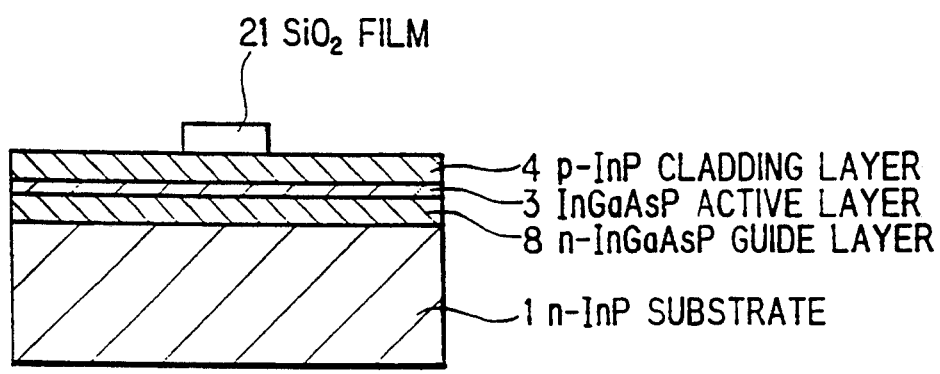

In FIG. 1B, a stripe-shaped $SiO_2$ film 21 having a width of 2 $\mu$m is formed on the p-InP cladding layer 4.

Figure 1C:
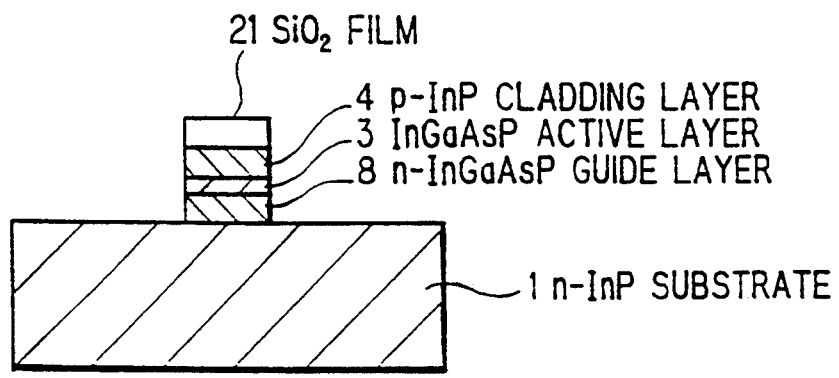

In FIG. 1C, wet-etching is so carried out that the n-InP substrate 1 is exposed on the surface except for a surface portion corresponding to the $SiO_2$ film 21.

Figure 1D:
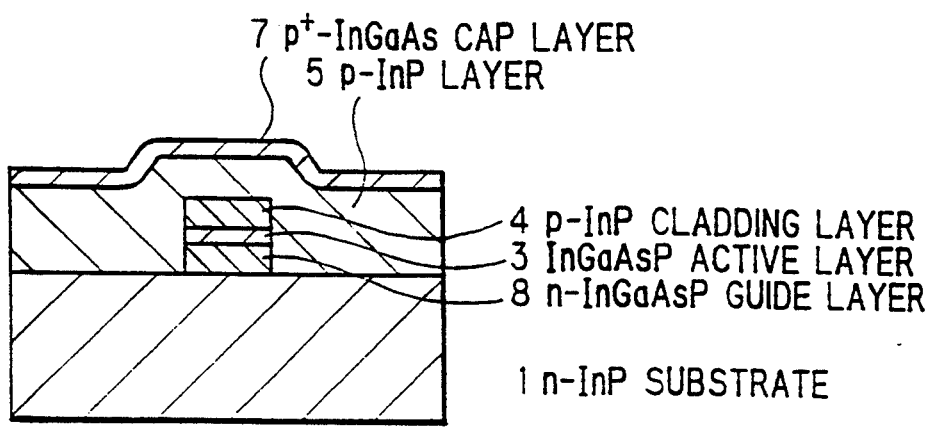

In FIG. 1D, a p-InP layer 5 and a p$^+$-InGaAs cap layer 7 are formed on the $SiO_2$ film-removed mesa structure comprising the layers 8, 3 and 4 and the surface-exposed InP substrate 1.

Figure 1E:
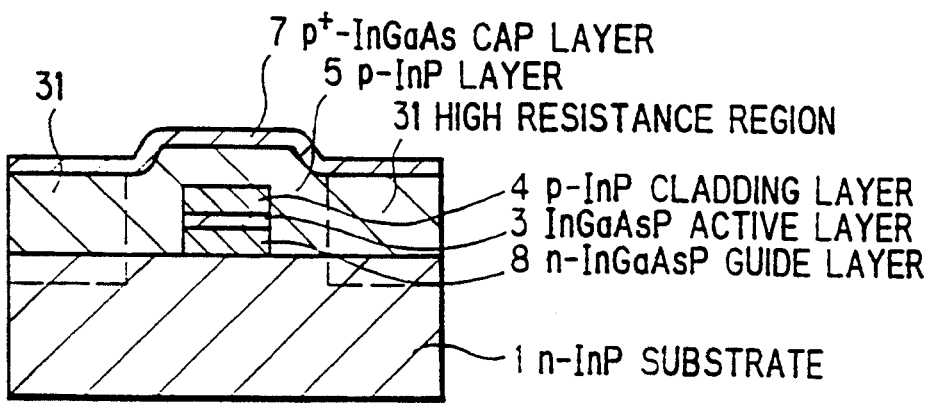

In FIG. 1E, protons are implanted into the p-InP layer 5 and the upper regions of the n-InP substrate 1 on the both sides the mesa structure including the active layer 3, so that high resistance regions 31 are formed to confine a current flowing between n- and p-electrodes (not shown) provided on the back surface of the n-InP substrate 1 and the top surface of the p$^+$-InGaAs cap layer.

The optical semiconductor laser thus fabricated is applied to an optical communication system, an optical information processing system, etc. In this optical semiconductor laser, however, the aforementioned disadvantages should be overcome.

Next, a method for fabricating an optical semiconductor device in the first preferred embodiment according to the invention will be explained in FIGS. 2A to 2F.

Figure 2A:
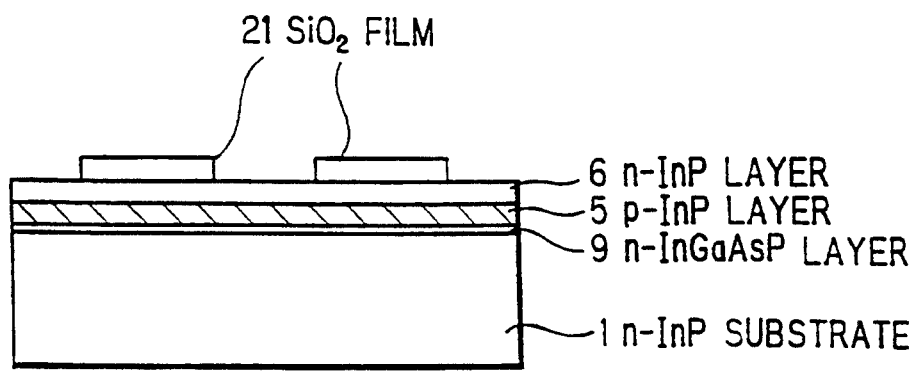
FIGS. 2A to 2F are schematic cross-sectional views showing a method for fabricating an optical semiconductor device in a first preferred embodiment according to the invention.

In FIG. 2A, an n-InGaAsP layer (etching-stop layer) 9 doped with Si by a carrier concentration of $1 \times 10^{18}$ cm$^{-3}$ and having a composition of 1.29 $\mu$m and a thickness of 100Å, a p-InP layer (current blocking layer) 5 doped with Zn by a carrier concentration of $5 \times 10^{17}$ cm$^{-3}$ and having a thickness of 0.5 $\mu$m, and an n-InP layer (current blocking layer) 6 doped with Si by a carrier concentration of $1 \times 10^{18}$ cm$^{-3}$ and having a thickness of 0.5 $\mu$m are successively grown on a surface having an orientation (100) of an n-InP substrate 1 by low pressure MOVPE. Next, a $SiO_2$ film 21 having a thickness of 2000Å is deposited on the n-InP layer 6 by CVD, and the $SiO_2$ film is etched to provide stripes having a width of 10 $\mu$m and an interval of 2 $\mu$m therebetween by photolithography.

Figure 2B:
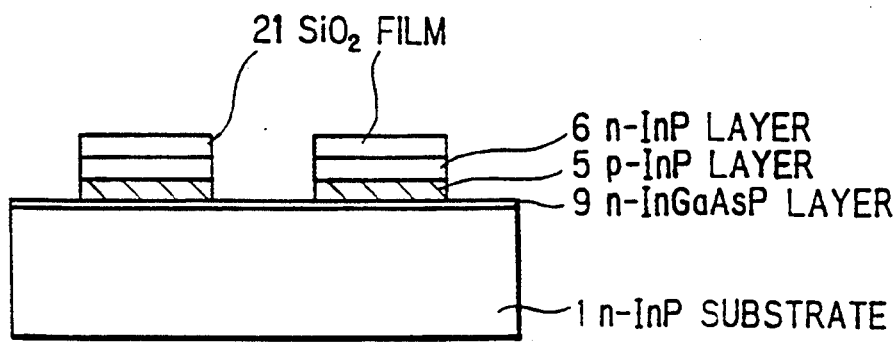

In FIG. 2B, the n-InP layer 6 and the p-InP layer 5 are etched by using mixture solution of HCl and $H_3PO_4$, wherein the stripes of the $SiO_2$ film 21 are used as masks.

Figure 2C:
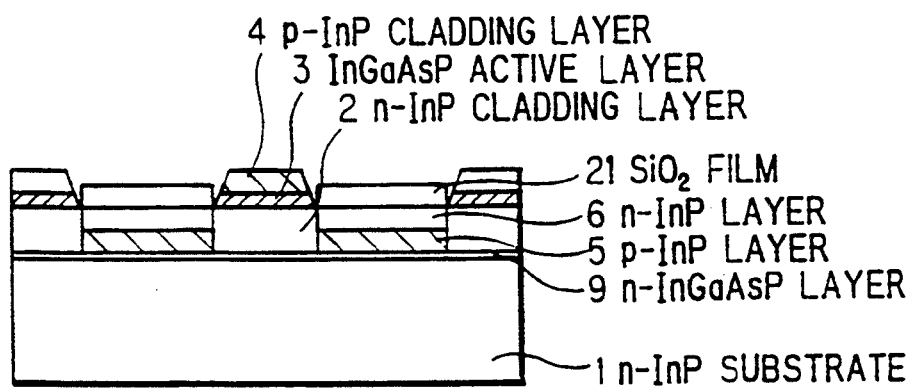

In FIG. 2C, an n-InP cladding layer 2 having a thickness of 1 $\mu$m and a carrier concentration of $1 \times 10^{18}$ cm$^{-3}$, an InGaAsP active layer 3 having a composition of 1.55 $\mu$m and a thickness of 800Å, and a p-InP cladding layer 4 having a thickness of 0.5 $\mu$m and a carrier concentration of $5 \times 10^{17}$cm$^{-3}$ are selectively grown on the exposed n-InGaAsP layer 9 by low pressure MOVPE. The thicknesses as explained above are those for the growth layers on the central etched portion of the n-InP substrate 1 having the n-InGaAsP layer 9 thereon.

Figure 2D:
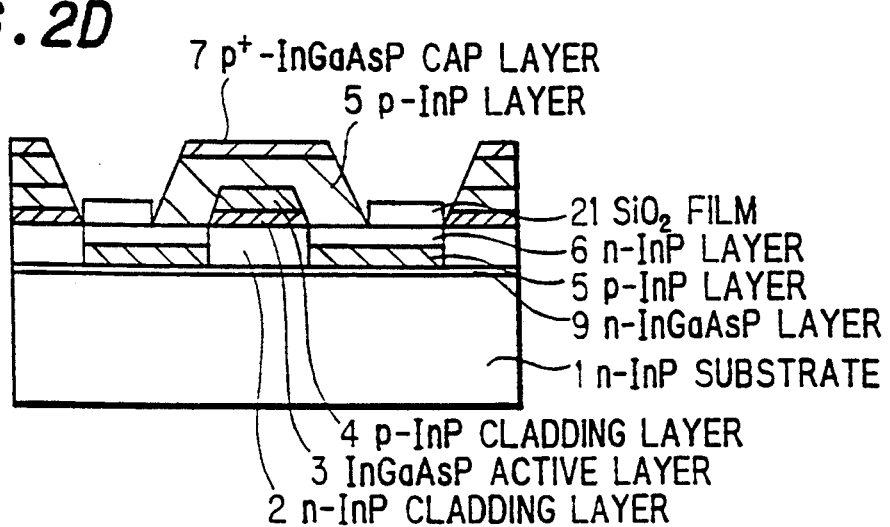

In FIG. 2D, the stripes of the $SiO_2$ film 21 are etched to be removed by a stripe having a width of 6 $\mu$m on the basis of the center of the active region, and a p-InP layer 5 having a thickness of 2 $\mu$m and a carrier concentration of $5 \times 10^{17}$ cm$^{-3}$, and a p$^+$-InGaAsP cap layer 7 having a thickness of 0.3 $\mu$m and a carrier concentration of $1 \times 10^{17}$cm$^{-3}$ are selectively grown by using the stripes of the left (unetched) $SiO_2$ film 21.

Figure 2E:
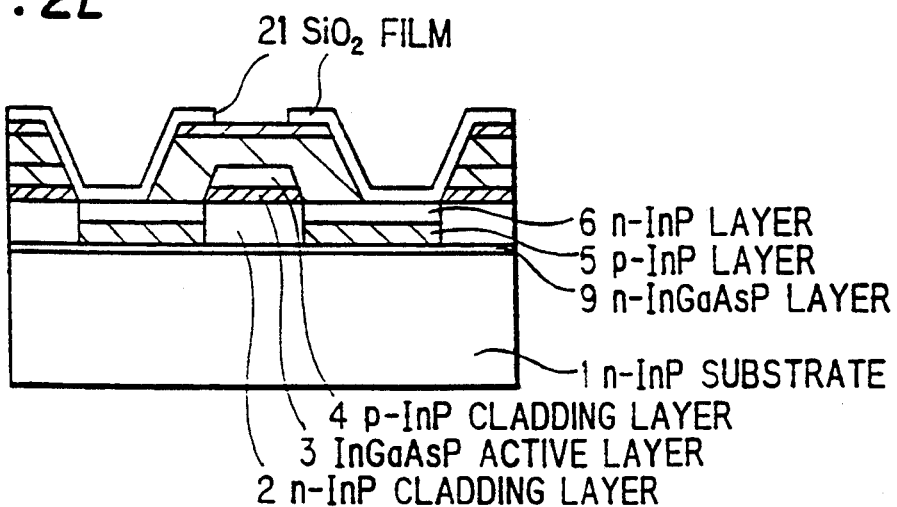

In FIG. 2E, a $SiO_2$ film 21 covering the whole surface of the layers thus processed is again formed, and a portion of the $SiO_2$ film 21 corresponding to the top surface of the active region is removed by a stripe having a width of 1.5 $\mu$m.

Figure 2F:
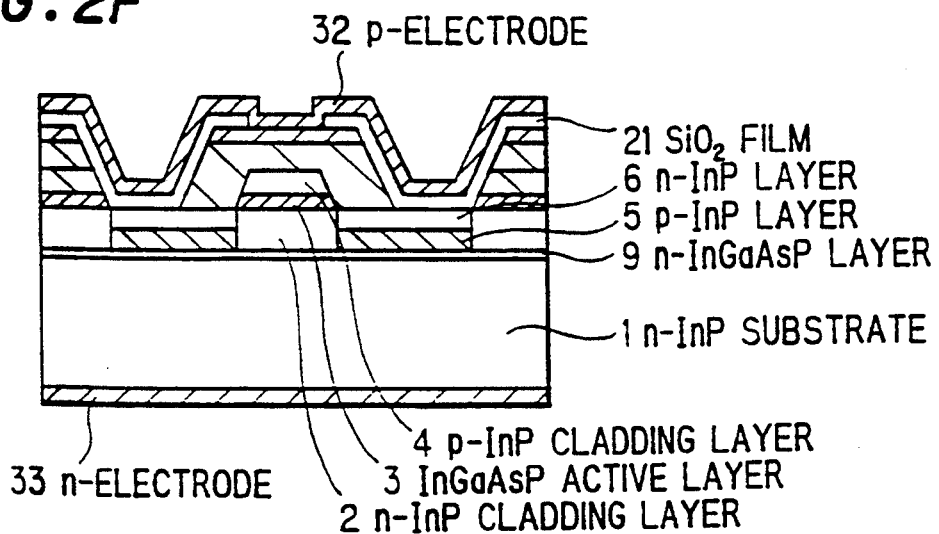

In FIG. 2F, a p-electrode is provided on the top surface of the layers thus stacked, and an n-electrode is provided on the back surface of the n-InP substrate 1.

The optical semiconductor laser thus fabricated is structured to provide a resonator length of 300 $\mu$m, and some properties thereof are measured to obtain the following results.

| | | |
|---|---|---|
| (a) | threshold current mean value | 15 mA |
| (b) | standard deviation of the threshold current | 0.2 mA |
| (c) | slope efficiency mean value | 0.3 w/A |
| (d) | standard deviation of the slope efficiency | 0.04 w/A |
| (e) | active layer width mean value | 2.0 $\mu$m |
| (f) | standard deviation of the active layer width | 0.12 $\mu$m |

As explained in the first preferred embodiment, parallel dielectric thin film stripes such as $SiO_2$ film stripes are formed along [011] orientation on a semiconductor surface having (100) orientation, and a doubleheterostructure is selectively grown on a region between the parallel stripes by MOVPE. Thus, a ridge having a flat (100) plane on the top and smooth and uniform (111) B plane on the sides is obtained to be sandwiched by the parallel stripes. Therefore, an active layer is defined, without using a method such as wet-etching having no uniformity, only by the pattern of the parallel stripes. For these reasons, optical semiconductor devices are fabricated on a large-area wafer by a total growth/process having superior uniformity and reproducibility.

Next, a method for fabricating an optical semiconductor device in the second preferred embodiment according to the present invention will be explained in FIGS. 3A to 3F.

Figure 3A:
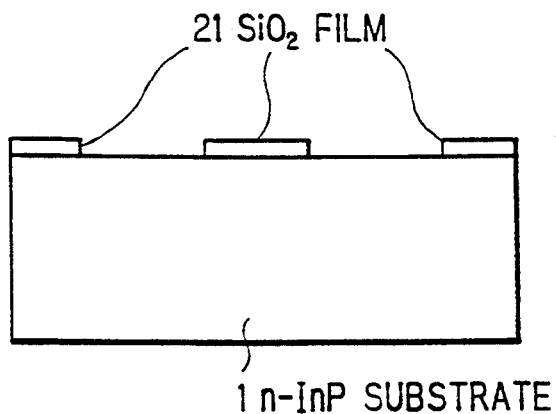

In FIG. 3A, a $SiO_2$ film 21 having a thickness of approximately 2000Å is deposited on a surface having an orientation (100) of an n-InP substrate 1 (a width of 12 $\mu$m) by CVD, and the $SiO_2$ film 21 is etched to provide stripes having a width of 2 $\mu$m, one of which is positioned in the center, by photolithography.

Figure 3B:
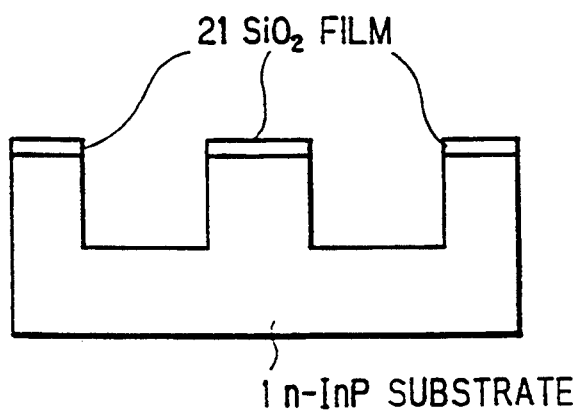

In FIG. 3b, the n-InP substrate 1 is etched to be formed with grooves having a depth of 1.5 $\mu$m by dry etching using the stripes of the $SiO_2$ film 21 as masks.

Figure 3C:
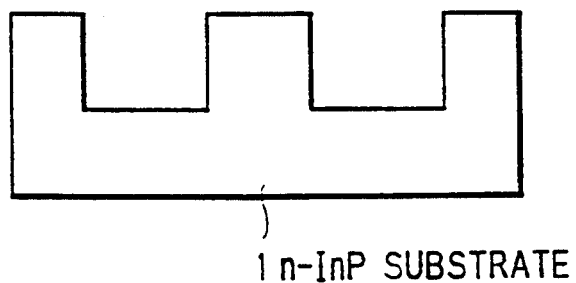

In FIG. 3C, the stripes of the $SiO_2$ film 21 is removed.

In FIG. 3D, an n-InP cladding layer 2 doped with Si by a carrier concentration of $1 \times 10^{18}$ cm$^{-3}$ and having a thickness of 1000Å, and an InGaAsP active layer 3 having a composition of 1.55 $\mu$m and a thickness of 800Å are grown on the etched substrate 1 by low pressure MOVPE, and a p-InP cladding layer 4 doped with Zn by a carrier concentration of $5\times10^{17}$ cm$^{-3}$ and having a thickness of 1.7 μm is then grown to cover the ridge portion having a width of 2 μm with (111) B plane, wherein the thickness of the layers are those measured on the basis of the center in the active region. Subsequently, an n-InP layer 6 having a carrier concentration of $1\times10^{18}$ cm$^{-3}$ and a thickness of 0.5 μm and a p-InP layer 5 are grown, so that the grooves are filled with the n-InP layer 6, and the whole surface of the layers thus grown is covered with the p-InP layer 5. Then, a p+-InGaAsP cap layer 7 having a thickness of 0.3 μm and a carrier concentration of $1\times10^{19}$ cm$^{-3}$ is grown on the p-InP layer 5. During the growth of the n-InP layer, no growth occurs on the p-InP cladding layer 4, because (111) B plane has growth speed suppressing effect.

In FIG. 3E, a SiO$_2$ film 21 is formed on the surface of the p+-InGaAsP cap layer 7, and a portion of the SiO$_2$ film 21 corresponding to the top of the active region is removed by a stripe having a width of 2 μm.

In FIG. 3F, a p-electrode 32 is provided on the exposed p+-InGaAsP cap layer 7 and the SiO$_2$ film 21, and an n-electrode 33 is provided on the back surface of the n-InP substrate 1.

The optical semiconductor laser thus fabricated is structured to provide a resonator length of 300 μm, and some properties are thereof are measured to obtain the following results.

| (a) | threshold current mean value | 10 mA |
| --- | --- | --- |
| (b) | standard deviation of the threshold current | 0.2 mA |
| (c) | slope efficiency mean value | 0.3 w/A |
| (d) | standard deviation of the slope efficiency | 0.04 w/A |
| (e) | active layer width mean value | 2.0 μm |
| (f) | standard deviation of the active layer width | 0.12 μm |

As explained in the second preferred embodiment, the active layer is well defined for the same reason as explained in the first preferred embodiment. In addition, the p-cladding layer on the active layer is grown to be covered with (111) B plane, so that a current blocking layer is suppressed in growth on the (111) B plane, when the current blocking layer is formed. Consequently, the formation of the current blocking layer is completed by one step of crystal growth.

In the first and second preferred embodiments, optical semiconductor layers are fabricated with high yield and low cost by MOVPE making it possible to realize uniform growth on large area wafers. Although the active layer of bulk InGaAsP is used, it may be replaced by a multiple quantum well structure, and the n- and p-layers may be inverted in conductivity type, respectively.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A method for fabricating an optical semiconductor device, comprising the steps of:
   forming an etching-stop layer, a current blocking layer, and a first dielectric layer successively on a semiconductor substrate;
   removing said first dielectric layer to provide stripes on said current blocking layer;
   etching said current blocking layer on said etching-stop layer by using said stripes as masks;
   filling a first semiconductor layer into an etched portion of said current blocking layer;
   carrying out a selective growth of a multiple layer structure including an active layer on said semiconductor layer; and
   proving p- and n-electrodes for injecting current to said active layer.

2. A method for fabricating an optical semiconductor device, according to claim 1, further comprising the steps of:
   removing said stripes partially to enlarge an interval between said stripes;
   carrying out a selective growth of a second semiconductor layer to cover said multiple layer structure; and
   forming a second dielectric layer to cover a whole surface of said second semiconductor layer except for a portion corresponding to a top surface of said active layer.

3. A method for fabricating an optical semiconductor device, according to claim 2, wherein:
   said semiconductor substrate is an n-InP substrate;
   said etching-stop layer is an n-InGaAsP layer;
   said current blocking layer includes p- and n-InP layers;
   said first and second dielectric layers are of a SiO$_2$ film;
   said first semiconductor layer is an n-InP cladding layer;
   said multiple layer structure includes said active layer of InGaAsP and a p-InP cladding layer; and
   said second semiconductor layer includes a p-InP layer and a p+-InGaAsP cap layer.

4. A method for fabricating an optical semiconductor device, comprising the steps of:
   etching a semiconductor substrate to provide a ridge and grooves thereon;
   growing a multiple layer structure including an active layer on said ridge and multiple layer structures in said grooves simultaneously, a top layer of said multiple layer structure including said active layer being grown to be covered on said active layer with (111) plane totally;
   growing first semiconductor layers on said multiple layer structures in said grooves;
   growing a second semiconductor to cover said multiple structure including said active layer on said ridge and a whole remaining portion of said etched semiconductor substrate; and
   providing p- and n-electrodes for injecting current to said active layer.

5. A method for fabricating an optical semiconductor device, according to claim 4,
   said semiconductor substrate is an n-InP substrate;
   said multiple layer structure including said active layer includes an n-InP cladding layer, said active layer of InGaAsP and said top layer of a p-InP cladding layer;
   each of said multiple layer structures in said grooves includes n-InP, InGaAsP and p-InP layers;
   said first semiconductor layer is an n-InP layer; and
   said second semiconductor layer includes a p-InP layer and a p+-InGaAs cap layer.

* * * * *